United States Patent
Lasalandra et al.

(10) Patent No.: US 7,646,582 B2
(45) Date of Patent: Jan. 12, 2010

(54) TEMPERATURE-COMPENSATED MICRO-ELECTROMECHANICAL DEVICE, AND METHOD OF TEMPERATURE COMPENSATION IN A MICRO-ELECTROMECHANICAL DEVICE

(75) Inventors: Ernesto Lasalandra, S. Donato Milanese (IT); Angelo Merassi, Vigevano (IT); Sarah Zerbini, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 463 days.

(21) Appl. No.: 11/244,439

(22) Filed: Oct. 5, 2005

(65) Prior Publication Data

US 2006/0086995 A1 Apr. 27, 2006

(30) Foreign Application Priority Data

Oct. 8, 2004 (EP) .................................. 04425753

(51) Int. Cl.
*H01G 5/00* (2006.01)
(52) U.S. Cl. ...................... 361/287; 361/286; 361/277; 361/278; 361/290; 361/292
(58) Field of Classification Search ......... 361/286–287, 361/290–292, 277–278, 281–283, 298.1; 333/186, 189
See application file for complete search history.

(56) References Cited

U.S. PATENT DOCUMENTS

| | | | |
|---|---|---|---|
| 5,747,991 A | 5/1998 | Ito et al. | |
| 5,780,885 A | 7/1998 | Diem et al. | |
| 5,783,973 A | 7/1998 | Weinberg et al. | 331/35 |
| 5,909,078 A | 6/1999 | Wood et al. | 310/307 |
| 5,983,721 A | 11/1999 | Sulzberger et al. | |
| 6,070,464 A | 6/2000 | Koury, Jr. et al. | |
| 6,417,743 B1* | 7/2002 | Mihailovich et al. | 333/24 C |
| 6,504,356 B2* | 1/2003 | Yao et al. | 324/99 R |

(Continued)

FOREIGN PATENT DOCUMENTS

DE 4226430 A1 2/1994

(Continued)

OTHER PUBLICATIONS

Esashi, M. et al., "Packaged Micromechanical Sensors," *1994 IEEE Symposium on Emerging Technologies & Factory Automation*, Tokyo, Japan, Nov. 6-10, 1994, pp. 30-37.

(Continued)

*Primary Examiner*—Nguyen T Ha
(74) *Attorney, Agent, or Firm*—Lisa K. Jorgenson; Harold H. Bennett, II; Seed IP Law Group PLLC

(57) ABSTRACT

A micro-electromechanical device includes a semiconductor body, in which at least one first microstructure and one second microstructure of reference are integrated. The first microstructure and the second microstructure are arranged in the body so as to undergo equal strains as a result of thermal expansions of the body. Furthermore, the first microstructure is provided with movable parts and fixed parts with respect to the body, while the second microstructure has a shape that is substantially symmetrical to the first microstructure but is fixed with respect to the body. By subtracting the changes in electrical characteristics of the second microstructure from those of the first, variations in electrical characteristics of the first microstructure caused by thermal expansion can be compensated for.

28 Claims, 5 Drawing Sheets

U.S. PATENT DOCUMENTS

| | | | |
|---|---|---|---|
| 6,506,989 B2 * | 1/2003 | Wang | 200/181 |
| 6,507,475 B1 * | 1/2003 | Sun | 361/281 |
| 6,583,374 B2 * | 6/2003 | Knieser et al. | 200/181 |
| 6,591,678 B2 | 7/2003 | Sakai | |
| 6,823,733 B2 | 11/2004 | Ichinose | |
| 6,887,732 B2 * | 5/2005 | Gopal et al. | 438/50 |
| 6,954,348 B1 * | 10/2005 | Rodgers | 361/277 |
| 6,980,412 B2 * | 12/2005 | Cheng et al. | 361/277 |
| 2005/0132805 A1 | 6/2005 | Park et al. | |

FOREIGN PATENT DOCUMENTS

| | | |
|---|---|---|
| DE | 19832906 C1 | 2/2000 |
| EP | 1 217 735 | 6/2002 |
| WO | 9852051 A1 | 11/1998 |
| WO | 03106927 A2 | 12/2003 |

OTHER PUBLICATIONS

Moe, S. T., et al., "Capacitive Differential Pressure Sensor for Harsh Environments," Sensors and Actuators, 83(2000), May 2000, pp. 30-33.

Seidel, H., et al., "A Piezoresistive Silicon Accelerometer with Monolithically Integrated CMOS-Circuitry," Transducers '95—Eurosensors IX, The 8$^{th}$ International Conference on Solid-State Sensors and Actuators, and Eurosensors IX, Stockholm, Sweden, Jun. 25-29, 1995, pp. 597-600.

* cited by examiner

US 7,646,582 B2

TEMPERATURE-COMPENSATED MICRO-ELECTROMECHANICAL DEVICE, AND METHOD OF TEMPERATURE COMPENSATION IN A MICRO-ELECTROMECHANICAL DEVICE

BACKGROUND OF THE INVENTION

1. Field of the Invention

The present invention relates to a temperature-compensated micro-electromechanical device and to a method of temperature compensation in a micro-electromechanical device.

2. Description of the Related Art

As is known, the use of micro-electromechanical systems (MEMS) is increasingly widespread in several sectors of technology and has yielded encouraging results especially in the construction of inertial sensors, micro-integrated gyroscopes, and electromechanical oscillators for a wide range of applications.

MEMS systems of this type usually comprise at least one mass, which is connected to a fixed body (stator) by means of springs and is movable with respect to the stator according to pre-determined degrees of freedom. The movable mass and the stator are capacitively coupled by a plurality of respective comb-fingered electrodes facing one another so as to form capacitors. The movement of the movable mass with respect to the stator, for example on account of an external stress, modifies the capacitance of the capacitors; from which it is possible to deduce the relative displacement of the movable mass with respect to the fixed body, and hence the degree of force applied to cause the movement. On the other hand, it is also possible to apply an electrostatic force to the movable mass to set it in motion, by supplying appropriate biasing voltages.

In optimal working conditions, MEMS systems present excellent performance; in particular, MEMS inertial sensors are extremely sensitive and precise. However, a limit of currently available MEMS systems lies in the strong dependence of their response upon the temperature. In fact, also on account of their extremely small dimensions, very modest variations in temperature can produce significant strains in micro-electromechanical structures. Such strains are equivalent to relative displacements of the electrodes of the movable mass with respect to those of the stator and cause a detectable variation of the capacitive coupling between stator and movable mass. In practice, then, an offset, due to the variations in temperature, is added to the output signal of the MEMS system.

To overcome this drawback, MEMS systems are frequently incorporated in special packages, made so as to reduce the effects of thermal expansion. Alternatively, it has been proposed to use compensation circuits that electrically erase the effects of possible thermal drifts. According to one solution, for example, a nonlinear element with a temperature dependent electrical characteristic is integrated in the reading interface of the MEMS system (a diode, for example). Another technique envisages, instead, the use of a temperature sensor.

The solutions illustrated above are, however, not really satisfactory both because in any case the achievable precision is not optimal and because high costs are involved. The special packages, in fact, cannot be of a standard type and hence have very high design and fabrication costs. The compensation circuits require burdensome procedures for measuring the thermal drifts and calibrating the compensation curves and, moreover, a sufficient stability over time cannot be guaranteed.

BRIEF SUMMARY OF THE INVENTION

Embodiments of the present invention provide a temperature-compensated micro-electromechanical device and a method of temperature compensation in a micro-electromechanical device.

According to one embodiment of the invention, a micro-electromechanical device is provided, comprising a semiconductor body, a first microstructure integrated in the body, and a second microstructure integrated in the body as a reference, and arranged so that the first microstructure and the second microstructure undergo equal strains as a result of thermal expansions of the body. The first microstructure comprises movable parts and fixed parts with respect to the body, while the second microstructure has a shape substantially symmetrical to the first microstructure, but is fixed in position with respect to the body.

The first and second microstructures are specularly symmetrical with respect to a symmetry axis of the body. That is to say that the second microstructure is a mirror image of the first microstructure, and they are symmetrically positioned with respect to a center of mass of the semiconductor body. According to an embodiment of the invention, the first microstructure includes a capacitive coupling between movable electrodes and fixed electrodes, while the second microstructure includes a capacitive coupling between electrodes in positions corresponding to the movable and fixed electrodes of the first microstructure. Because of their substantially identical configuration, the capacitive couplings of the first and second microstructures are substantially identical in their response to changes in temperature, though only the first microstructure is movable with respect to the substrate.

According to an embodiment of the invention, a method is provided in which changes in the capacitive coupling of the first microstructure are employed to detect acceleration of the semiconductor body, while changes in the capacitive coupling of the second microstructure are employed to compensate for changes in the capacitive coupling of the first microstructure caused by thermal effects.

BRIEF DESCRIPTION OF THE SEVERAL VIEWS OF THE DRAWING(S)

For a better understanding of the invention, some embodiments thereof are now described, purely by way of non-limiting example and with reference to the attached drawings, in which.

DETAILED DESCRIPTION OF THE INVENTION

Figure 1:
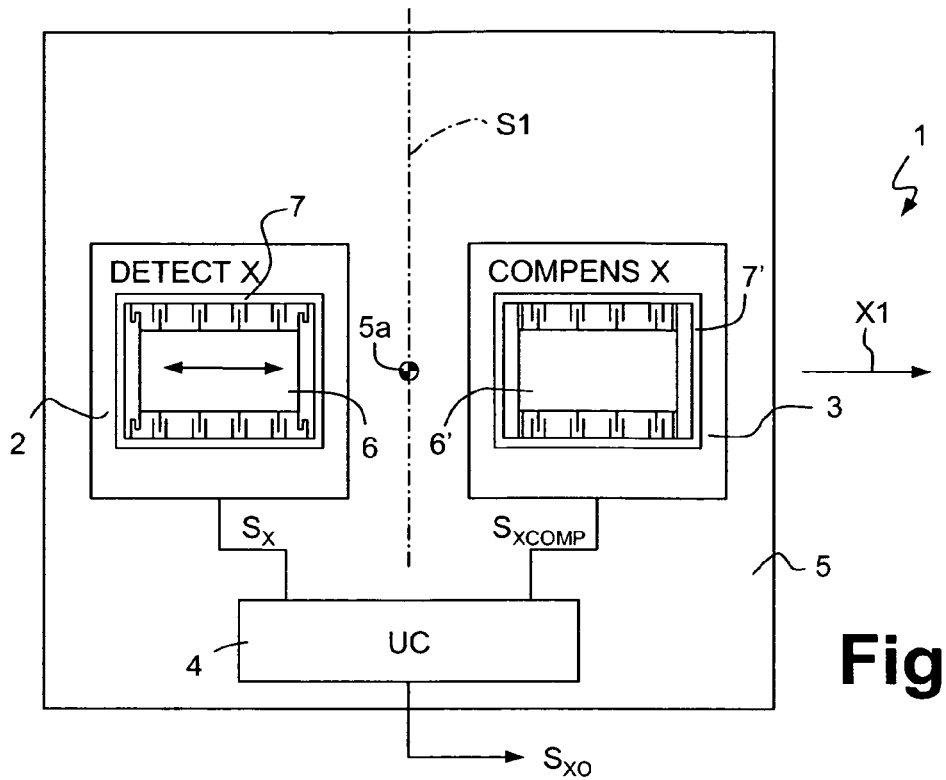
FIG. 1 is a simplified block diagram of a micro-electromechanical device according to a first embodiment of the present invention.

FIG. 1 illustrates a linear MEMS accelerometer 1 having a detection axis X1. The MEMS accelerometer 1 comprises a detection microstructure 2 and a reference microstructure 3 that are substantially identical to one another and are both integrated in a same chip 5 of semiconductor material, together with a control unit 4. More precisely, the chip 5 has a rectangular or square shape and has a geometrical center 5a, which is also a center of symmetry. The detection microstructure 2 and the reference microstructure 3 are specular with respect to a symmetry axis S1 which is perpendicular to the detection axis X1 and passes through the center 5a of the chip 5. The detection microstructure 2 and the reference microstructure 3 are moreover connected to the control unit 5 for supplying a measurement signal $S_X$, correlated to the accelerations imparted to the chip 5 according to the detection axis X1, and, respectively, a compensation signal $S_{COMP}$ indicating the expansion to which the chip 5 is subjected as a result of the temperature.

With reference to FIGS. 2-5, the detection microstructure 2 comprises a suspended mass 6 and a stator structure 7, which is fixed to a substrate 8 of the chip 5 and separated from the suspended mass 6 in a conventional way by means of insulating regions (not illustrated). A trench 9, in this case filled with dielectric material, separates the stator structure 7 laterally from the substrate 8. The suspended mass 6 is mechanically connected to the stator structure 7 by a plurality of elastic connection elements 10 (four, in the example described), so shaped as to enable the suspended mass 6 to oscillate with respect to the stator structure 7 in the direction of the detection axis X1. The elastic connection elements 10 (FIG. 3) extend from the suspended mass 6 and are fixed to respective suspension anchorages 11 of the stator structure 7.

Figure 4:
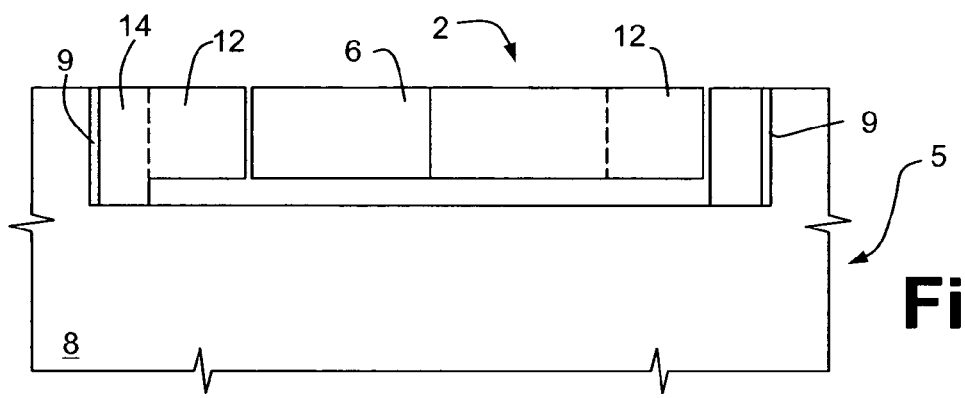
Figure 5:
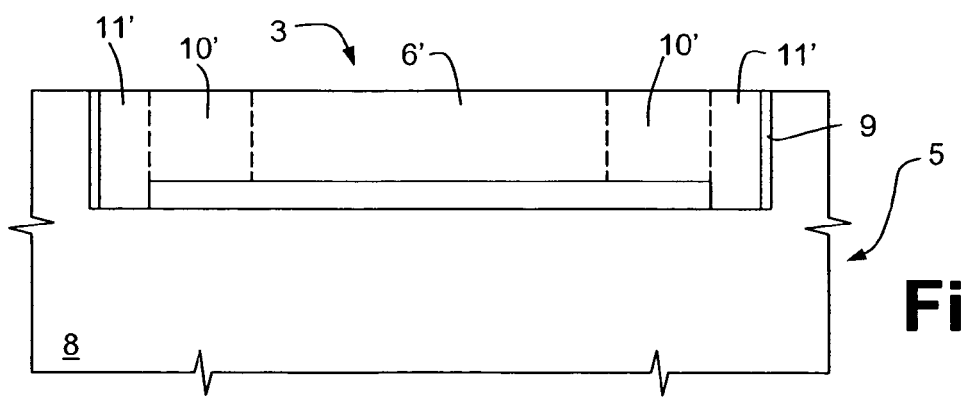

The suspended mass 6 and the stator structure 7 are provided with respective plane detection electrodes 12, arranged perpendicular to the detection axis X1 and comb-fingered (see also FIG. 4). In greater detail, the detection electrodes 12 of the suspended mass 6 project from the suspended mass 6 itself towards the stator structure 7; instead, the detection electrodes 12 of the stator structure 7 are fixed to respective stator anchorages 14 and project towards the suspended mass 6, at a distance from the substrate 8 of the chip 5. Furthermore, each detection electrode 12 of the suspended mass 6 faces and is capacitively coupled to a respective pair of detection electrodes 12 of the stator structure 7. In turn, the detection electrodes 12 of the stator structure 7 are electrically connected to one another in sets, according to conventional schemes of MEMS accelerometers (not illustrated in detail herein). The detection microstructure 2 is also equipped with the normal electrical connections of one-axis linear accelerometers (not illustrated herein) for connection of the detection electrodes 12 to the control unit 4.

The reference microstructure 3 is substantially identical and is arranged symmetrically to the detection microstructure 2 with respect to the symmetry axis S1, which is perpendicular to the detection axis X1 and passes through the center 5a of the chip 5. In particular, the reference microstructure 3 comprises a suspended mass 6' and a stator structure 7', which have the same shapes and dimensions as the suspended mass 6 and, respectively, the stator structure 7 of the detection microstructure 2 and are separated from one another in a conventional way by means of insulating regions (not illustrated). The stator structure 7' is delimited laterally by the substrate 8 of the chip 5 by means of a trench 9' filled with dielectric material. In the case of the reference microstructure 3, however, the suspended mass 6' is rigidly connected to the stator structure 7' by means of rigid connection elements 10', which are substantially non-deformable. The suspended mass 6' is hence fixed with respect to the stator structure 7'. The rigid connection elements 10' project from the suspended mass 6', at a distance from the substrate 8 of the chip 5, and are fixed to respective suspension anchorages 11', which have the same shape and the same relative distances as the first suspension anchorages 11 of the detection microstructure 2 (see also FIG. 5). The suspended mass 6' and the stator structure 7' are provided with respective plane detection electrodes 12', arranged perpendicular to the detection axis X1 and comb-fingered. The detection electrodes 12' of the reference microstructure 3 have the same shape and the same relative positions as the detection electrodes 12 of the detection microstructure 2. In particular, the detection electrodes 12' of the suspended mass 6' project therefrom towards the stator structure 7'; the detection electrodes 12' of the stator structure 7' are instead fixed to respective stator anchorages 14' and project towards the suspended mass 6'. Furthermore, each detection electrode 12' of the suspended mass 6' faces and is capacitively coupled to a respective pair of detection electrodes 12' of the stator structure 7'. The detection electrodes 12' of the stator structure 7' are connected to one another in sets according to conventional schemes of MEMS accelerometers and are not illustrated herein in detail. The stator anchorages 14' of the reference microstructure 3 have the same shape and the same relative distances as the stator anchorages 14 of the detection microstructure 2. Also the reference microstructure 3 is provided with the normal electrical connections (not illustrated) of the one-axis linear MEMS accelerometers for connection of the detection electrodes 12' with the control unit 4.

In use, the detection microstructure 2 and the reference microstructure 3 are read by the control unit 4 using conventional reading modalities of linear MEMS accelerometers. As described above, moreover, the detection microstructure 2 and the reference microstructure 3 are substantially identical and, since they are also integrated in the same chip 5, they are deformed exactly in the same way as a result of thermal expansion. In particular, the relative distances of the suspension anchorages 11' and of the stator anchorages 14' of the reference microstructure 3, even though they are not fixed, remain in any case equal to the relative distances of the corresponding suspension anchorages 1 and stator anchorages 14 of the detection microstructure 2. For this reason, the configuration of the detection electrodes 12' of the suspended mass 6' and of the stator structure 7' of the reference microstructure 3 is always equal to the rest configuration (i.e., in the absence of accelerations along the detection axis X1) of the detection electrodes 12 of the suspended mass 6 and of the stator structure 7 of the detection microstructure 2. Consequently, temperature variations of the chip 5 cause identical variations in the measurement signal $S_X$ and in the compensation signal $S_{COMP}$. However, in the measurement signal $S_X$ the effect of temperature variations is superimposed on the effect of the accelerations according to the detection axis X1, whereas the variations of the compensation signal $S_{COMP}$ depend exclusively upon thermal expansion, because the suspended mass 6' of the reference microstructure 3 is fixed. The compensation signal $S_{COMP}$ can thus be used for effective compensation of the effects of thermal expansion on the measurement signal $S_X$.

For this purpose, the control unit 4 subtracts the compensation signal $S_{COMP}$ from the measurement signal $S_X$ for generating the output acceleration signal $S_{XO}$.

The location of the detection microstructure 2 and of the reference microstructure 3 in specularly symmetrical positions with respect to the symmetry axis S1 of the chip 5 enables maximum precision of compensation to be achieved, also considering that, on account of the thermal expansion, the chips tend to undergo deformation and to assume a cup-like shape. Owing to the described arrangement, the compensation is extremely precise because, practically in any operating condition, the thermal expansion acts homogeneously on the detection microstructure 2 and on the reference microstructure 3.

Figure 6:
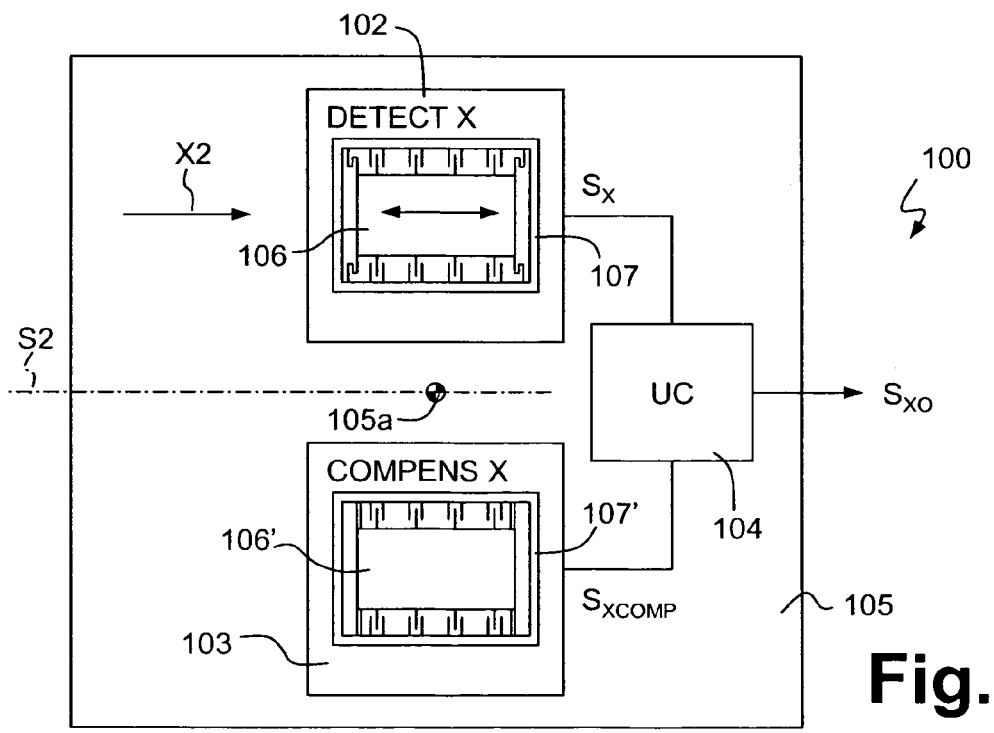
FIG. 6 is a simplified block diagram of a micro-electromechanical device according to a second embodiment of the present invention.
Figure 2:
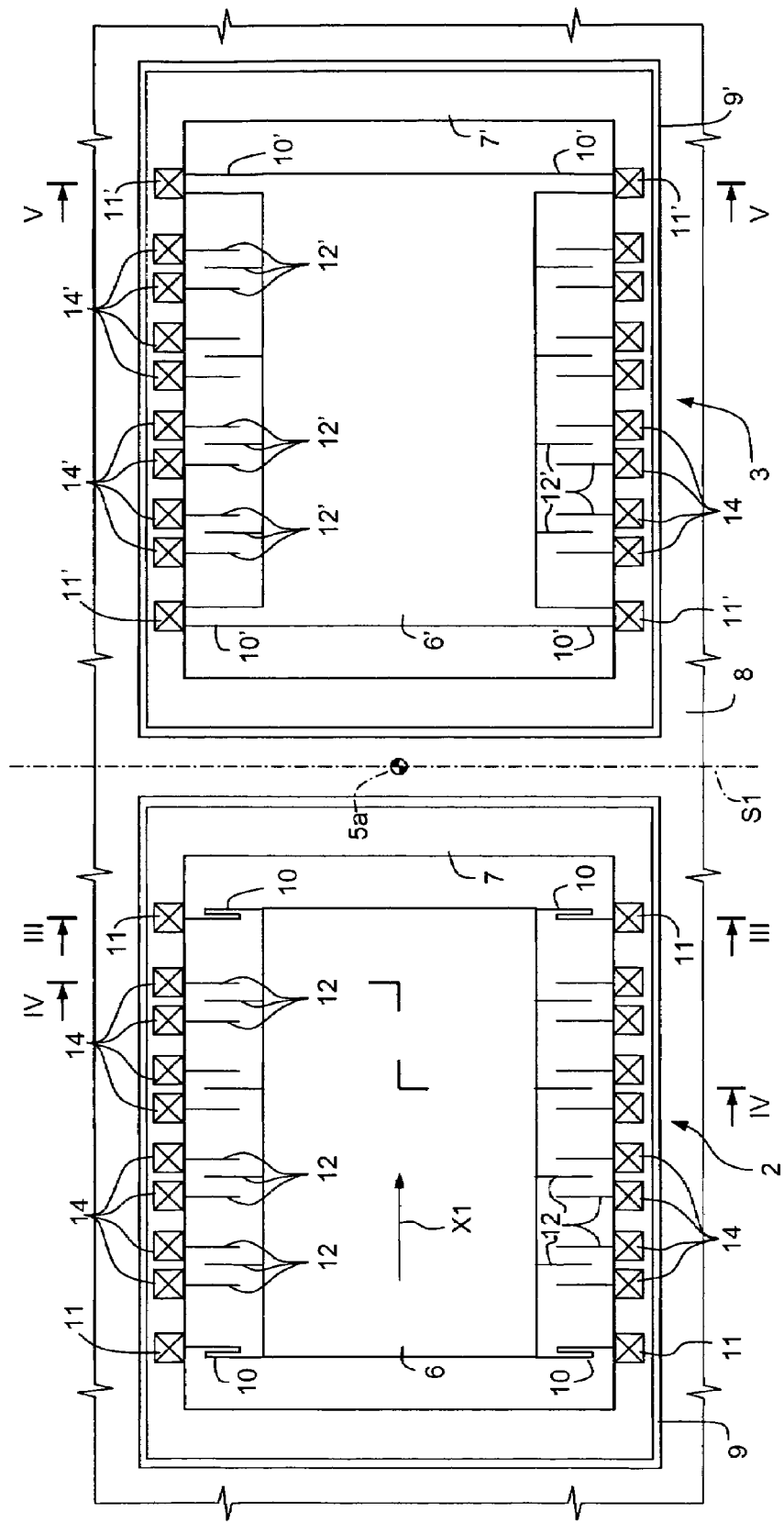
FIG. 2 is a schematic top plan view of a part of a semiconductor chip included in the device of FIG. 1.
Figure 3:
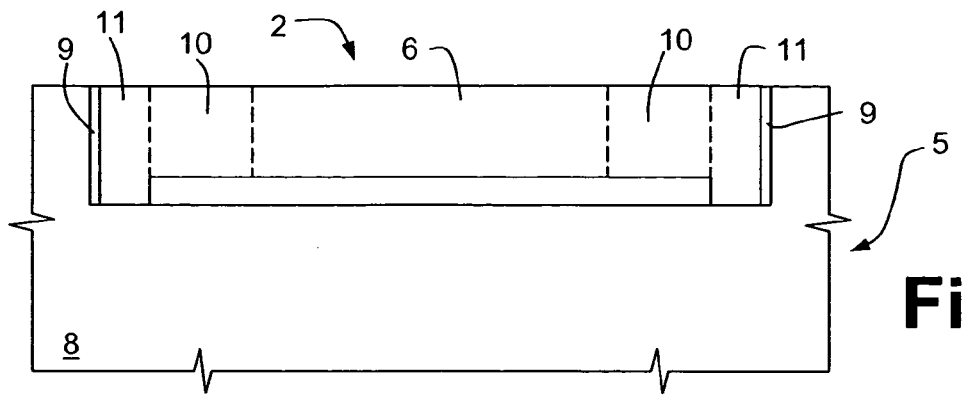
FIGS. 3-5 are cross sections through the chip of FIG. 2, taken, respectively, along the lines III-III, IV-IV and V-V of FIG. 2.

According to an alternative embodiment of the invention, illustrated in FIG. 6, a linear MEMS accelerometer 100 having a detection axis X2 comprises a detection microstructure 102, a reference microstructure 103, and a control unit 104, integrated in a semiconductor chip 105 of a square or rectangular shape and having a center 105a of symmetry. The detection microstructure 102 and the reference microstructure 103 are of the type illustrated in FIG. 2. In particular, the detection microstructure 102 comprises a suspended mass 106, movable along the detection axis X2 with respect to a fixed stator structure 107; and the detection microstructure 103 comprises a suspended mass 106' and a stator structure 107', both fixed and having the same shape and the same dimensions as the suspended mass 106 and, respectively, as the stator structure 107 of the detection microstructure 102. Furthermore, the detection microstructure 102 and the reference microstructure 103 are specularly symmetrical with respect to a symmetry axis S2, parallel to the detection axis X2 and passing through the center 105a of the chip 105, and are aligned in a direction perpendicular to the detection axis X2 itself.

Figure 7:
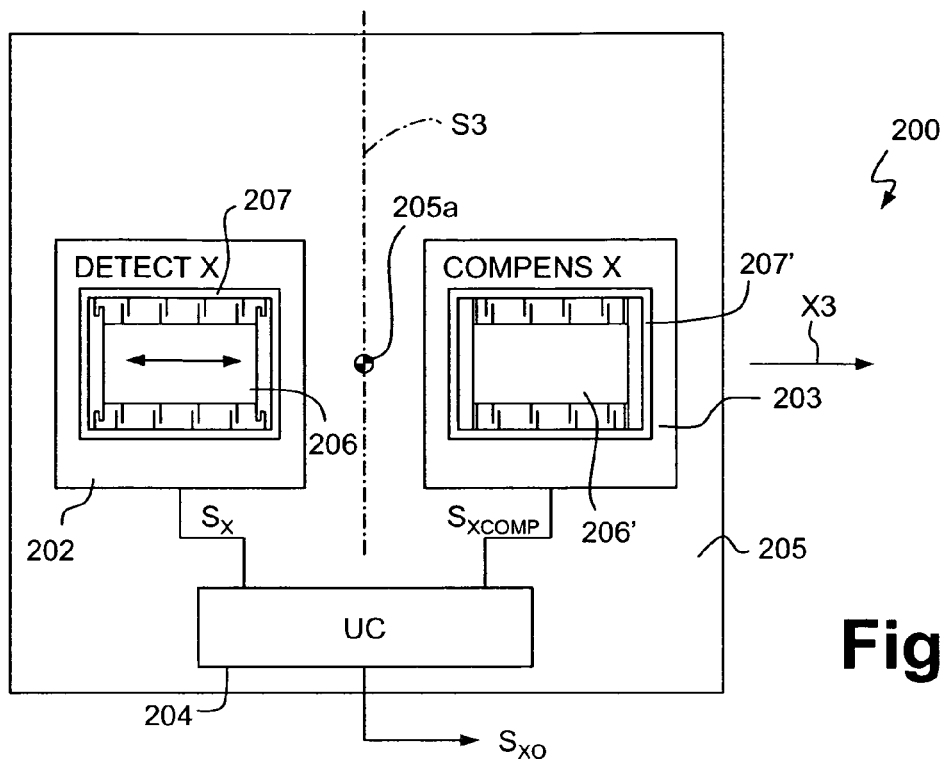
FIG. 7 is a simplified block diagram of a micro-electromechanical device according to a third embodiment of the present invention.
Figure 8:
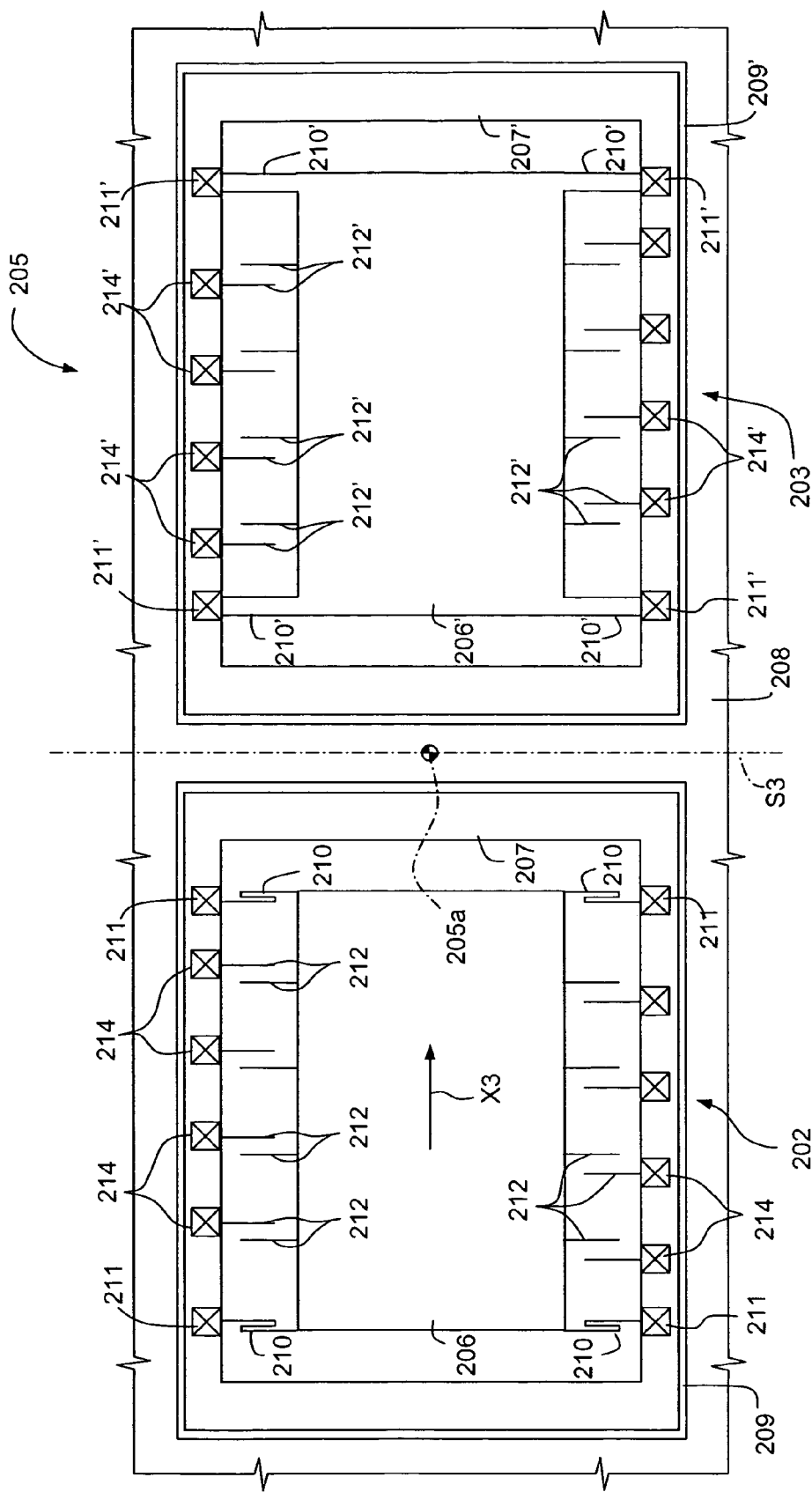
FIG. 8 is a schematic top plan view of a part of a semiconductor chip included in the device of FIG. 7.

A third embodiment of the invention is illustrated in FIGS. 7 and 8. In this case, a linear MEMS accelerometer 200 having a detection axis X3 comprises a detection microstructure 202, a reference microstructure 203 and a control unit 204, which are integrated in a semiconductor chip 205 of a square or rectangular shape and having a center 205a of symmetry. The detection microstructure 202 and the reference microstructure 203 are identical to one another and are symmetrical with respect to a symmetry axis S3 perpendicular to the detection axis X3 and passing through the center 205a of the chip 205. In greater detail, the detection microstructure 202 comprises a suspended mass 206, a stator structure 207, and elastic connection elements 210, which connect the suspended mass 206 to respective suspension anchorages 211 of the stator structure 207 in a way similar to what is described in relation to the detection microstructure 2 of FIG. 2. In particular, the suspended mass 206 of the detection microstructure 202 is constrained to the stator structure 207 so as to be oscillatable according to the detection axis X3. The suspended mass 206 and the stator structure 207 of the detection microstructure 202 are separated from one another in a conventional way by insulating regions (not illustrated) and are provided with respective comb-fingered detection electrodes 212, facing one another in pairs to establish a capacitive coupling. More precisely, each electrode 212 of the stator structure 207 is fixed to a respective anchoring stator 214 and is coupled to a respective detection electrode 212 of the suspended mass 206. Furthermore, with reference to the arrangement of FIG. 6, the detection electrodes 212 arranged on the top side of the suspended mass 206 have their right-hand face coupled to the left-hand face of the respective detection electrode 212 of the stator structure 207; instead, the detection electrodes 212 set on the bottom side of the suspended mass 206 have their left-hand face coupled to the right-hand face of the respective detection electrode 212 of the stator structure 207. The detection electrodes 212 of the stator microstructures 207 are connected to one another in sets in a conventional way and not illustrated in detail.

The reference microstructure 203 comprises a suspended mass 206' and a stator structure 207', having the same shape and the same dimensions as the suspended mass 206 and as the stator structure 207 of the detection microstructure 202 and separated from one another in a conventional way by insulating regions (not illustrated). The suspended mass 206' is rigidly connected to the stator structure 207' by means of rigid connection elements 210', which are substantially non-deformable. In particular, the rigid connection elements 210' are fixed to respective suspension anchorages 211' of the stator structure 207'. The suspended mass 206' and the stator structure 207' of the reference microstructure 203 are capacitively coupled by a plurality of respective comb-fingered detection electrodes 212', which are arranged symmetrically to the detection electrodes 212 of the detection microstructure 202 with respect to the symmetry axis S3. More precisely, each detection electrode 212' of the stator structure 107' is fixed to a respective anchoring stator 214 and is coupled to a respective detection electrode 212' of the suspended mass 206'. With reference to the arrangement of FIG. 6, the detection electrodes 212' arranged on the top side of the suspended mass 206' have their left-hand face coupled to the right-hand face of the respective detection electrode 212' of the stator structure 207'; instead, the detection electrodes 212' set on the bottom side of the suspended mass 206' have their right-hand face coupled to the left-hand face of the respective detection electrode 212' of the stator structure 207'. Furthermore, the relative distances of the suspension anchorages 211' and of the stator anchorages 214' of the reference microstructure 203 are equal to the relative distances of the corresponding suspension anchorages 211 and stator anchorages 214 of the detection microstructure 202. The detection electrodes 212' of the stator microstructures 207' are connected to one another in sets in a conventional way and not illustrated in detail.

Figure 9:
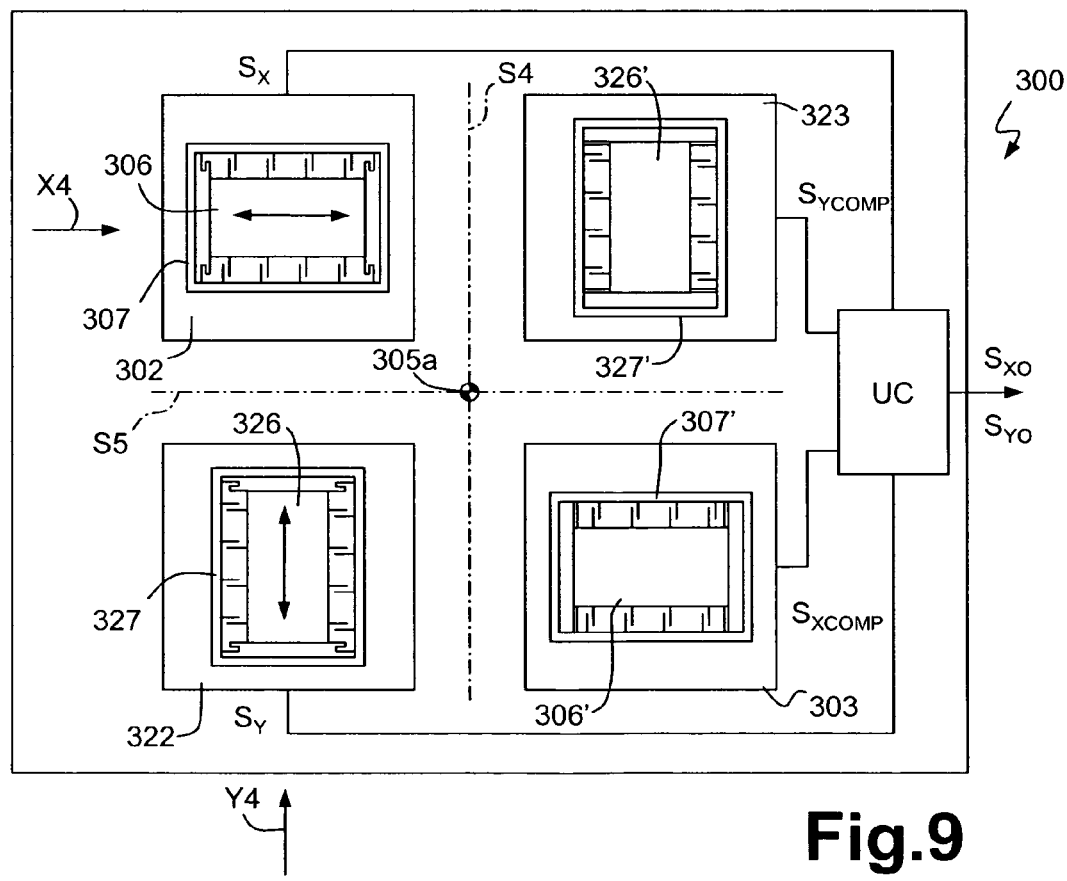
FIG. 9 is a simplified block diagram of a micro-electromechanical device according to a fourth embodiment of the present invention.

According to a fourth embodiment of the invention, illustrated schematically in FIG. 9, a MEMS accelerometer 300 has a first detection axis X4 and a second detection axis Y4 perpendicular to one another. The MEMS accelerometer 300 comprises a first detection microstructure 302 and a second detection microstructure 322, a first reference microstructure 303 and a second reference microstructure 323, and a control unit 304 integrated in a same semiconductor chip 305, of square or rectangular shape and having a center 305a of symmetry. The microstructures 302, 322, 303, 323 are all of the type described above with reference to FIGS. 7 and 8. In detail, the first detection microstructure 302 and the first reference microstructure 303 comprise respective suspended masses, designated by 306 and 306', having the same shape and dimensions; and respective stator structures, designated by 307 and 307', which also have the same shapes and dimensions. Furthermore, in the first detection microstructure 302, the suspended mass 306 is movable according to the first detection axis X4 with respect to the stator structure 307, whereas in the first reference microstructure 303 the suspended mass 306' is fixed. The second detection microstructure 322 and the second reference microstructure 323 comprise: respective suspended masses, designated by 326 and 326', having the same shape and dimensions; and respective stator structures, designated by 327 and 327', which also have the same shapes and dimensions. Furthermore, in the first detection microstructure 322, the suspended mass 326 is movable according to the second detection axis Y4 with respect to the stator structure 327, whereas in the second reference microstructure 323 the suspended mass 326' is fixed.

The first detection microstructure 302 detects the accelerations which act according to the first detection axis X4. The second detection microstructure 322 is rotated by 90° in the plane of FIG. 8 to detect the accelerations which act according to the second detection axis Y4. The first reference microstructure 303 is arranged symmetrically to the first detection microstructure 302 with respect to the center 305a of the chip 305. In practice, the configuration of the first reference microstructure 303 is obtained by overturning through 180° the first detection microstructure 302 (in the rest position) once about a first overturning axis S4 and once about a second overturning axis S5, which are parallel to the first detection axis X4 and to the second detection axis Y4, respectively, and pass through the center 305a of the chip 305. Similarly, the second reference microstructure 323 is arranged symmetrical to the second detection microstructure 322 with respect to the center 305a of the chip 305. The configuration of the second reference microstructure 323 is obtained by overturning through 180° the second detection microstructure 322 (in the resting position) once about the first axis S4 and once about the second overturning axis S5.

The first and second detection microstructures 302, 322 provide the control unit 304 with a first measurement signal $S_X$ and with a second measurement signal $S_Y$, which are correlated to the accelerations acting on the chip 305 according to the first detection axis X4 and to the second detection axis Y4, respectively. The first and the second reference microstructures 303, 323 provide the control unit 304 with a first compensation signal $S_{COMPX}$ and with a second compensation signal $S_{COMPY}$, which indicate the amount of the thermal expansion of the chip 305 in the direction of the first detection axis X4 and of the second detection axis Y4, respectively. Finally, the control unit 304 generates a first output acceleration signal $S_{XO}$, by subtracting the first compensation signal $S_{COMPX}$ from the first measurement signal $S_X$; and a second output acceleration signal $S_{YO}$, by subtracting the second compensation signal $S_{COMPY}$ from the second measurement signal $S_Y$.

In the fourth embodiment, in practice, the precision of the compensation is maximized, by arranging the detection microstructure and the compensation microstructure symmetrically with respect to the center of the chip.

Finally, it is clear that modifications and variations can be made to the device and to the method described herein, without thereby departing from the scope of the present invention, as defined in the annexed claims.

In particular, the invention can be exploited for compensating the effects of thermal expansion in various types of MEMS devices that use a mass that oscillates with respect to a fixed body, such as, for example, two-axes or three-axes linear accelerometers, rotational accelerometers, inclinometers, gyroscopes, pressure sensors, and electromechanical oscillators.

The control unit can be made separately, on a chip different from the one containing the microstructures.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A micro-electromechanical device comprising:
a semiconductor body;
a first microstructure, including a first suspended mass, integrated in said body; and
a second microstructure of reference, including a second suspended mass, integrated in said body and arranged so that said first microstructure and said second microstructure undergo equal strains as a result of thermal expansions of said body.

2. The device according to claim 1 wherein said first suspended mass is movable with respect to said body, and said second suspended mass has a shape substantially symmetrical to said first suspended mass and is fixed with respect to said body.

3. The device according to claim 2, comprising a third microstructure, integrated in said body and having a third suspended mass that is movable with respect to the body, and a fourth microstructure of reference, integrated in said body, having a shape substantially symmetrical to said third microstructure, and fixed with respect to said body.

4. The device according to claim 2 wherein said first microstructure comprises a first stator structure, and said second microstructure comprises a second stator structure.

5. The device according to claim 4 wherein said second microstructure comprises a second suspended mass, having substantially the same shape and the same dimensions as said first suspended mass, and said second stator structure has substantially the same shape and the same dimensions as said first stator structure.

6. The device according to claim 5 wherein said first suspended mass is anchored to first suspension anchorages, said second suspended mass is anchored to second suspension anchorages, and relative distances of said first suspension anchorages are equal to corresponding relative distances of said second suspension anchorages.

7. The device according to claim 5 wherein said first suspended mass and said first stator structure are capacitively coupled by a plurality of respective first electrodes, first electrodes of said first stator structure being anchored to first stator anchorages, and wherein said second suspended mass and said second stator structure are capacitively coupled by a plurality of respective second electrodes, second electrodes of said second stator structure being anchored to second stator anchorages.

8. The device according to claim 7 wherein relative distances of said first stator anchorages are equal to corresponding relative distances of said second stator anchorages.

9. The device according to claim 7 wherein each of the first electrodes of one of the first stator structure and the first suspended mass is capacitively coupled to a respective pair of the first electrodes of the other of the first stator structure and the first suspended mass, and each of the second electrodes of one of the second stator structure and the second suspended mass is capacitively coupled to a respective pair of the second electrodes of the other of the second stator structure and the second suspended mass.

10. The device according to claim 7 wherein each of the first electrodes of the first stator structure is capacitively coupled to a respective one of the first electrodes of the first suspended mass, and each of the second electrodes of the second stator structure is capacitively coupled to a respective one of the second electrodes of the second suspended mass.

11. The device according to claim 1 wherein said first microstructure and said second microstructure are specularly symmetrical with respect to a symmetry axis of said body.

12. The device according to claim 11 wherein the symmetry axis is perpendicular to a detection axis of the first microstructure.

13. The device according to claim 11 wherein the symmetry axis is parallel to a detection axis of the first microstructure.

14. The device according to claim 1 wherein said first microstructure and said second microstructure are symmetrical with respect to a center of symmetry of said body.

15. The device according to claim 1, comprising a control unit, electrically connected to said first microstructure and to said second microstructure for receiving a first signal and, respectively, a second signal, and generating a third signal compensated in temperature on the basis of said first signal and of said second signal.

16. The device according to claim 1 wherein the first microstructure and the second microstructure are aligned according to a direction parallel to a detection axis of the first microstructure.

17. The device according to claim 1 wherein the first microstructure and the second microstructure are aligned according to a direction perpendicular to a detection axis of the first microstructure.

18. A micro-electromechanical device, comprising:
a substrate of semiconductor material;
a first body coupled to the substrate and configured to move with respect to the substrate along a first axis; and
a second body having overall dimensions and mass substantially equal to overall dimensions and mass of the first body, the second body being rigidly coupled to the substrate so as to resist movement with respect to the substrate.

19. The device of claim 18, comprising:
a first capacitive coupling between the first body and the substrate that is configured to vary in capacitive value in response to changes of acceleration of the substrate;
a second capacitive coupling between the second body and the substrate that is configured to be substantially insensitive to changes of acceleration of the substrate and is configured to vary in capacitive value in response to changes in temperature, to a degree substantially equal to variations in capacitive value of the first capacitive coupling between the first body and the substrate in response to changes in temperature.

20. The device of claim 18, comprising:
a first capacitive coupling between the first body and the substrate, the first body being configured to move with respect to the substrate in response to a change of potential at the first capacitive coupling between the first body and the substrate; and
a second capacitive coupling between the second body and the substrate that is configured to vary in capacitive value in response to changes in temperature, to a degree substantially equal to variations in capacitive value of the first capacitive coupling between the first body and the substrate in response to changes in temperature.

21. The device of claim 18 wherein the first and second bodies are coupled to the substrate in a symmetrical and balanced relationship with each other relative to a center of mass of the semiconductor substrate.

22. The device of claim 18 wherein the first body is coupled to the substrate via a plurality of springs formed in a layer of the substrate.

23. The device of claim 18, comprising:
a third body coupled to the substrate and configured to move with respect to the substrate along a second axis substantially perpendicular to the first axis; and
a fourth body having overall dimensions and mass substantially equal to the overall dimensions and mass of the third body, the fourth body rigidly coupled to the substrate so as to resist movement with respect to the substrate.

24. The device of claim 18 wherein the first body is configured to move with respect to the substrate along a second axis substantially perpendicular to the first axis.

25. The device of claim 18 wherein the first and second bodies are symmetrical with respect to an axis of symmetry of the substrate, the axis of symmetry lying perpendicular to the first axis.

26. The device of claim 18 wherein the first and second bodies are symmetrical with respect to an axis of symmetry of the substrate, the axis of symmetry lying parallel to the first axis.

27. The device of claim 18, comprising:
a first plurality of electrodes coupled to the substrate;
a second plurality of electrodes coupled to the first body, each of the second plurality of electrodes being capacitively coupled to a respective one of the first plurality of electrodes;
a third plurality of electrodes coupled to the substrate; and
a fourth plurality of electrodes coupled to the second body, each of the fourth plurality of electrodes being capacitively coupled to a respective one of the third plurality of electrodes.

28. The device of claim 18, comprising:
a first plurality of electrodes coupled to the substrate;
a second plurality of electrodes coupled to the first body, each of the second plurality of electrodes being capacitively coupled to a respective pair of the first plurality of electrodes;
a third plurality of electrodes coupled to the substrate; and
a fourth plurality of electrodes coupled to the second body, each of the fourth plurality of electrodes being capacitively coupled to a respective pair of the third plurality of electrodes.

* * * * *

UNITED STATES PATENT AND TRADEMARK OFFICE
CERTIFICATE OF CORRECTION

PATENT NO. : 7,646,582 B2
APPLICATION NO. : 11/244439
DATED : January 12, 2010
INVENTOR(S) : Lasalandra et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 868 days.

Signed and Sealed this

Sixteenth Day of November, 2010

David J. Kappos
*Director of the United States Patent and Trademark Office*